(12) United States Patent
Lin

(10) Patent No.: US 8,001,410 B2
(45) Date of Patent: *Aug. 16, 2011

(54) EFFICIENT CLOCKING SCHEME FOR ULTRA HIGH-SPEED SYSTEMS

(75) Inventor: Feng Lin, Boise, ID (US)

(73) Assignee: Micron Technology, Inc., Boise, ID (US)

(*) Notice: Subject to any disclaimer, the term of this patent is extended or adjusted under 35 U.S.C. 154(b) by 366 days.

This patent is subject to a terminal disclaimer.

(21) Appl. No.: 12/264,354

(22) Filed: Nov. 4, 2008

(65) Prior Publication Data

US 2009/0058478 A1 Mar. 5, 2009

Related U.S. Application Data

(63) Continuation of application No. 11/183,947, filed on Jul. 18, 2005, now Pat. No. 7,454,646.

(51) Int. Cl.
| | |
|---|---|
| G06F 1/00 | (2006.01) |
| G06F 1/12 | (2006.01) |
| G06F 12/00 | (2006.01) |
| H03K 3/84 | (2006.01) |
| H03K 5/01 | (2006.01) |
| H03K 21/00 | (2006.01) |
| H03L 7/00 | (2006.01) |
| H03B 21/00 | (2006.01) |
| H03B 5/20 | (2006.01) |
| H03B 5/08 | (2006.01) |
| G11C 8/00 | (2006.01) |
| H04L 7/00 | (2006.01) |

(52) U.S. Cl. ........ 713/500; 713/400; 713/600; 327/164; 327/165; 331/25; 331/40; 331/135; 331/172; 365/233.1; 375/354; 377/47; 711/167

(58) Field of Classification Search .................. 713/400, 713/500, 600; 311/25, 40, 135, 172; 327/164, 327/165; 365/233.1; 375/354; 377/47; 711/167; 331/25, 40, 135, 172

See application file for complete search history.

(56) References Cited

U.S. PATENT DOCUMENTS

| | | | |
|---|---|---|---|
| 5,734,877 A | 3/1998 | Ries et al. | |
| 6,044,122 A | 3/2000 | Ellersick et al. | |
| 6,061,418 A * | 5/2000 | Hassoun | 377/47 |
| 6,564,359 B2 * | 5/2003 | Saeki | 716/113 |
| 6,614,865 B1 * | 9/2003 | Ishimi | 375/373 |
| 6,798,259 B2 | 9/2004 | Lin | |
| 7,161,391 B2 | 1/2007 | Lin | |

(Continued)

OTHER PUBLICATIONS

S. Pellerano; S. Levantino; A 13.5-mW 5-GHz Frequency Synthesizer With Dynamic-Logic Frequency Divider; Feb. 2004; 6 pages.

*Primary Examiner* — Stefan Stoynov
(74) *Attorney, Agent, or Firm* — Fletcher Yoder

(57) ABSTRACT

There is provided a system for comparing the phase characteristics of three generated clock signals, each having a unique phase relationship with an original clock signal, with the original clock signal and to select a signal based on the proximity of the phase characteristic of the three signals to the original signal. The selection of a clock signal that most closely approximates the original significantly reduces lock time when attempting to synchronize an internal clock with an external clock. Additionally, there is provided a method for comparing three clock signals with an original clock signal and selecting from the three clock signals one that is approximately in phase with the original clock signal.

18 Claims, 6 Drawing Sheets

U.S. PATENT DOCUMENTS

| | | |
|---|---|---|
| 7,221,201 B2 | 5/2007 | Lin et al. |
| 2002/0070783 A1 | 6/2002 | Saeki |
| 2005/0057285 A1 | 3/2005 | Austin et al. |
| 2005/0122153 A1 | 6/2005 | Lin |
| 2007/0013418 A1 | 1/2007 | Lin |
| 2007/0033464 A1 | 2/2007 | Lin |

* cited by examiner

_US 8,001,410 B2_

1

EFFICIENT CLOCKING SCHEME FOR ULTRA HIGH-SPEED SYSTEMS

CROSS-REFERENCE TO RELATED APPLICATIONS

This application is a continuation of U.S. patent application Ser. No. 11/183,947 which was filed on Jul. 18, 2005. U.S. patent application Ser. No. 11/183,642, which was also filed on Jul. 18, 2005, entitled "Methods and Apparatus for Dividing a Clock Signal," by Feng Lin, is commonly owned and hereby incorporated by reference.

BACKGROUND OF THE INVENTION

1. Field of the Invention

The present invention relates generally to the field of integrated circuits. More particularly, the invention relates to a fast and efficient system and method for selecting a single internal clock signal from multiple internal clock signals to synchronize with an external clock signal.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In modern systems clock signals are used to coordinate the various operations across circuits, devices and integrated circuits. Due to a variety of reasons, however, a single clock signal is typically inadequate to accommodate all the devices in complex circuits and computer systems. For example, a particular device may operate at a different frequency than a processor, thus necessitating multiple clock signals with multiple frequencies. Additionally, there may be issues associated with jitter performance and skewing of the clock signal when it is distributed at speeds approaching the several-gigahertz-range. One common method for minimizing some of the problems associated with distributing a clock signal at high speeds and achieving various frequencies is locally dividing an external clock and then reproducing or regenerating the clock signal. Once a new clock signal is generated locally it is synchronized with the original clock signal so that the operations of the local device can be coordinated with the rest of the system. The procedure of synchronization of the internal clock may take a relatively large amount of time considering the speeds of today's devices and may bottleneck the system. Therefore there exists a need to more efficiently synchronize a local clock signal with an external clock signal.

Embodiments of the present invention may address one or more of the problems discussed above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

The present invention provides a system of reducing the required lock time for synchronous circuits by reducing the length of the delay line used in the synchronous circuit. The system generates three internal clock signals from an external clock signal. Each of the signals is separated by 1tCK or 2tCK depending on whether the external clock signal is divided by 3 or 6. One of the three signals is selected based on the timing of the three clock signals relative to a feedback signal. The selected signal is then used for feedback and synchronization purposes. Because the three clock signals are separated by 1tCK or 2tCK, the total length of the delay line can be reduced to a maximum of 1tCK or 2tCK as opposed to 3tCK or 6tCK if only one signal were used for synchronization purposes, thereby significantly increasing locking efficiency. Accordingly, the total lock time can be improved by as much as 66.67%. In another aspect of the invention, a method for improving the lock time comprises generating three internal clock signals and selecting one of the three signal based on timing characteristics relative to an external clock signal.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As described above, many issues arise when distributing a clock for synchronous devices and circuits, especially at high speeds. A common way to minimize or eliminate many of the issues includes producing or generating a local clock signal and then synchronizing the local clock signal with the original clock signal using a synchronizing device, such as a delay-lock loop (DLL) circuit. As the amount of time required for synchronization can be relatively significant, the present invention improves the efficiency of the synchronization device by reducing the length of the delay line employed in the synchronization device and thereby reducing the total lock time associated with synchronization. As will be appreciated, the length of the digital delay line employed in a DLL is determined by the worst-case internal clock period (typically, 6tCK) and fast operating corners (tdfast) such as high voltage, cold temperature and fast (process) transistors. For instance, in conventional devices, the number of delay elements (N) may be determined by the equation: N=6tck/tdfast. In accordance with embodiments of the present invention, the number of delay elements may be determined by the equation: N=2tck/tdfast. If tdfast=100 ps and tck=0.5 ns, the number of delay elements may be reduced from N=30 to N=10.

The improved efficiency is achieved in accordance with embodiments of the present invention by providing a system and method that generates three clock signals and then selects one of the signals to be used for synchronization purposes based upon the relative phase relationship of the signals to the feedback signal. Embodiments of the present invention may be used in a synchronous circuit such as a synchronous dynamic random access memory (SDRAM) device. As will be appreciated, embodiments of the present invention may also be useful in a number of other synchronous devices or circuits.

Figure 1:
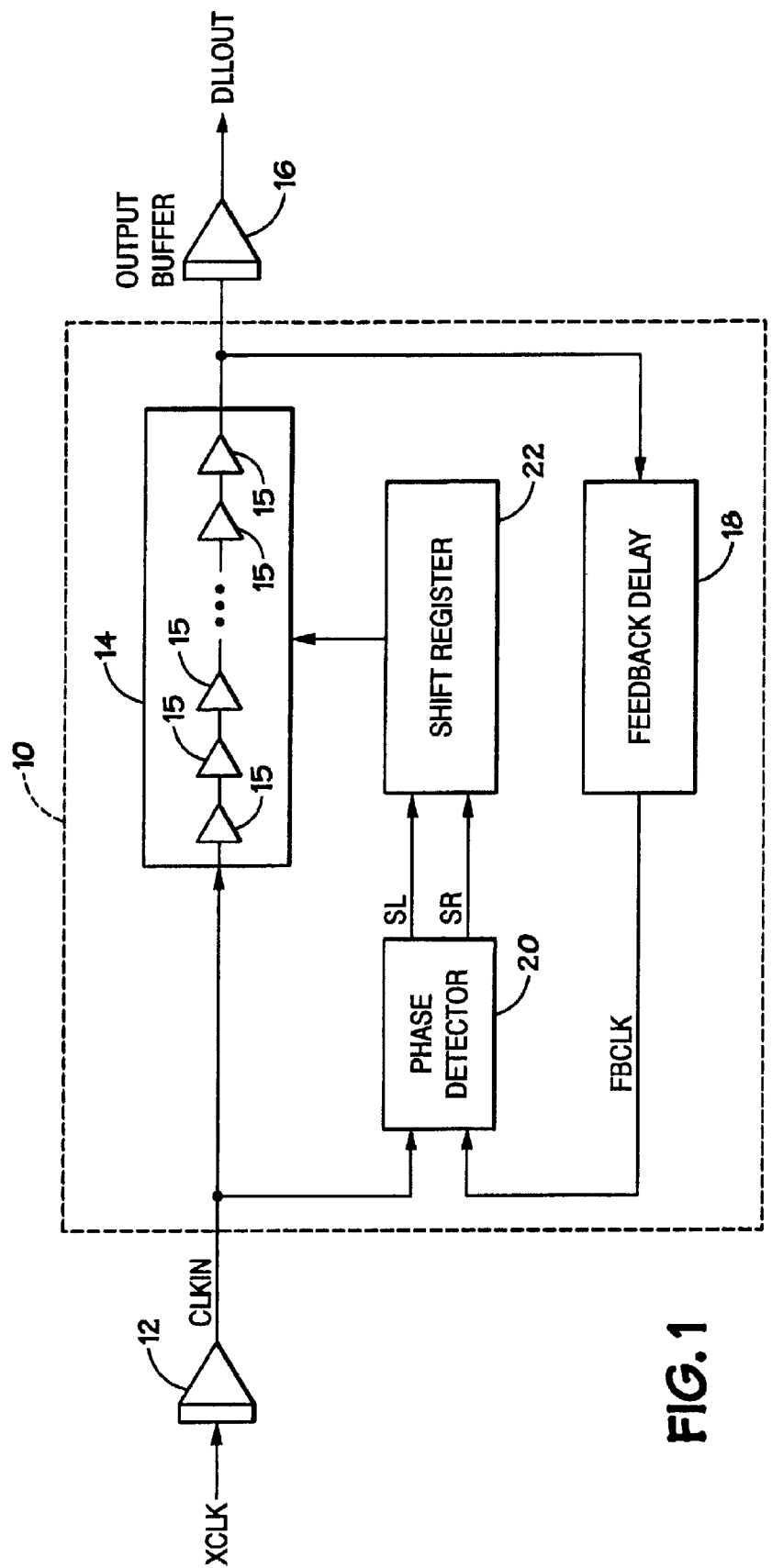
FIG. 1 illustrates a block diagram of an exemplary delay-lock loop.

Referring initially to FIG. 1, a DLL 10 is illustrated. In the DLL circuit 10, a reference signal, such as an external clock signal XCLK, is received by a clock receiver buffer 12 and provided to a delay line 14 as a buffered clock signal CLKIN. The external clock signal XCLK may be a system clock or any other clock signal, for example. The delay line 14 includes a number of delay elements 15, such as inverters. By providing a number of delay elements 15, the entry point of the buffered clock signal CLKIN may be adjusted to provide a lock through a range of frequencies, temperatures, voltages, etc. The output of the delay line 14 is connected to an output buffer 16 and a feedback delay circuit 18. The feedback delay circuit 18 provides a feedback clock signal (FBCLK) that is transmitted to the phase detector 20 for comparison with the buffered reference clock signal CLKIN. The phase detector 20 determines whether a difference exists between the phase of the feedback clock signal FBCLK and the buffered reference clock signal CLKIN. The detected phase difference determines the amount of delay to be introduced to or removed from the delay line 14 by a delay line control, such as the shift register 22, such that the buffered reference clock signal CLKIN may be shifted by an appropriate amount to produce an output clock signal DLLOUT that aligns, or locks, with the reference clock signal XCLK. While the present embodiment illustrates a shift register 22, any other suitable means of controlling the timing of the delay line 14, such as a state machine, a look-up table, a counter, etc. may be used. Further, while the present embodiment illustrates only an output buffer 16 in the output path of the delay line 14, it should be understood, that the output path may include other elements, such as a clock distribution or fanout circuit which may be used to distribute the synchronized output clock signal DLLOUT to other components in the device (e.g., SDRAM) implementing the DLL 10.

When the DLL circuit 10 has locked the data output signal DLLOUT to the reference clock signal XCLK, then essentially no difference should exist between the phases of the buffered clock signal CLKIN and the clock feedback signal FBCLK. The degree of acceptable phase difference will depend on the application and the precision of the DLL (i.e., the number and size of the delay elements 15 included in the delay line 14). Thus, a DLL 10 is locked when the total delay in the forward path is equal to one or multiple clock cycles. Expressed another way:

$$d_{forward} = t_{input\ buffer} + t_{delay\ line} + t_{output\ buffer} = n*tck, \text{ where } n >= 1$$

$$d_{feedback} = t_{delay\ line} + t_{feedback}$$

$$d_{forward} = d_{feedback}$$

where $d_{forward}$ corresponds to the delay between the reference clock signal XCLK and the data output signal DLLOUT; $d_{feedback}$ corresponds to the delay between the buffered clock signal CLKIN and the clock feedback signal FBCLK; $t_{input buffer}$ corresponds to the delay of the clock receiver buffer 12; $t_{delay}$ line corresponds to the delay in the delay line 14; $t_{output\ buffer}$) corresponds to the delay of the output buffer 16; and $t_{feedback}$ corresponds to the delay in the feedback delay circuit 18. Thus, to achieve phase lock, $$t_{feedback} = t_{input\ buffer} + t_{output\ buffer}$$

Thus, the feedback delay circuit 18 introduces delays in the feedback path corresponding to the delay ($t_{input\ buffer}$) introduced by the clock receiver buffer 12 and the delay ($t_{output\ buffer}$) introduced by the output buffer 16. Because $t_{feedback}$ is a constant, when the input changes frequency, the $t_{delay}$ line should change in response to the changing input. The phase detector 20 provides the shift register 22 with a shift left (SL) or shift right (SR) signal depending on whether the buffered clock signal CLKIN is too fast or too slow. The shift register 22 then shifts the entry point of the delay line 15 by one delay element. The process is repeated until the input signals to the phase detector 20 are phase equal at which point the clock signals are synchronized and the DLL 10 is locked. As previously discussed, the synchronized output signal DLLOUT can be used as the internal clock for a particular device such as SDRAM. In such a case, the internal clock would synchronize read and write operations to and from memory cells with the requesting application.

Figure 2:
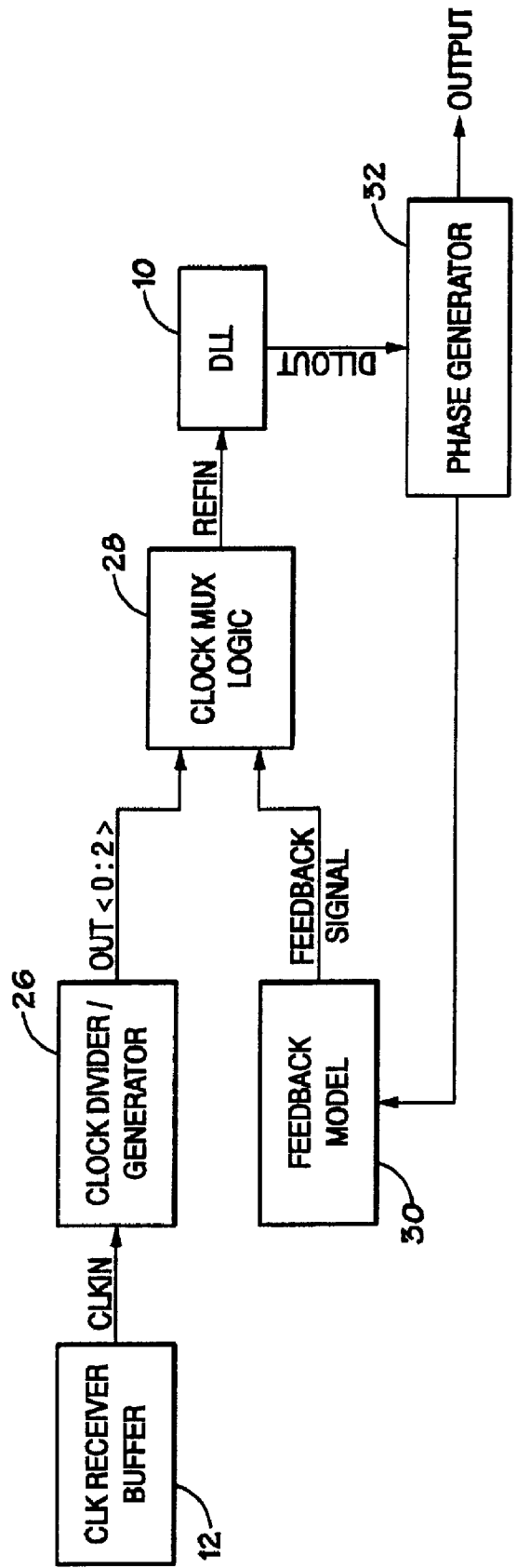
FIG. 2 illustrates a block diagram in accordance with embodiments of the present invention.

FIG. 2 is a block diagram of a system in accordance with an embodiment of the present invention. Specifically, a buffered clock signal CLKIN from the clock receiver buffer 12 is delivered to a clock divider and generator 26. The clock divider and generator 26 is based on true single phase logic instead of conventional static logic allowing it to receive and process external clock signals at high frequencies, such as in the range of 2.5 to 4 gigahertz. The clock divider and generator 26 divides the external clock signal (here CLKIN) by a predetermined amount, either three or six. The clock divider and generator 26 will be described in greater detail below with reference to FIG. 3.

Figure 3:
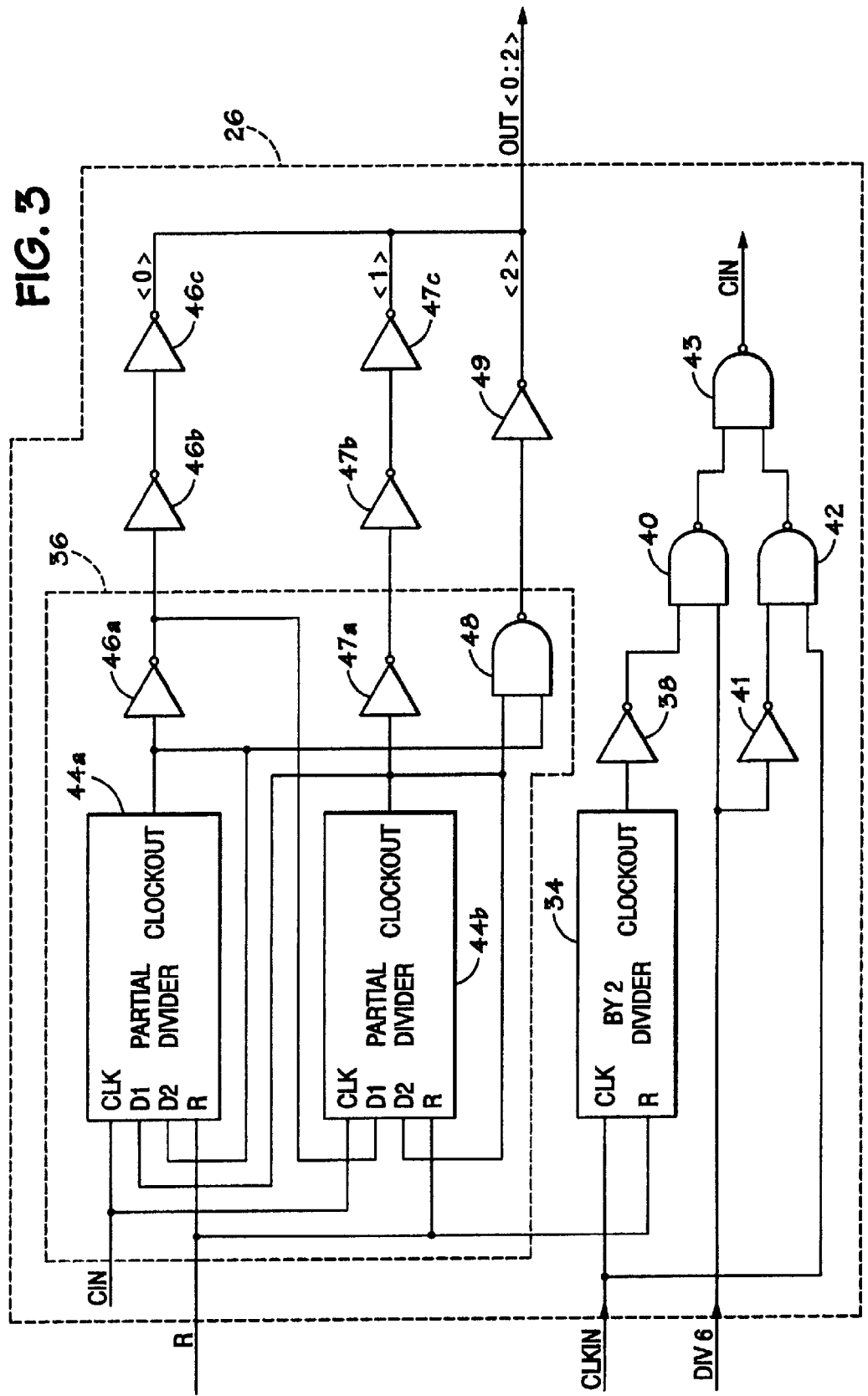
FIG. 3 is a schematic depiction of the clock divider and generator circuit of FIG. 2, in accordance with embodiments of the present invention.

In accordance with embodiments of the present techniques and as discussed further with reference to FIG. 3, the clock divider and generator 26 generates three clock signals OUT<0:2> from the divided clock signal. The three generated clock signals OUT <0:2> are delivered to a clock selection circuit, such as the clock mux logic 28. The clock mux logic 28 is used to determine the phase relationship of each of the signals relative to a feedback signal. The clock mux logic 28 selects one of the three generated clock signals based on its phase relationship to the feedback signal. The selected clock signal is used for DLL and synchronization purposes. Specifically, the selected signal is delivered to the DLL 10 and then sequentially to the phase generator 32 (as the DLL output signal DLLOUT), the feedback model 30 and back into the clock mux logic 28 (as the feedback signal FEEDBACK). As will be appreciated, the clock mux logic 28 is also modeled for the feedback signal FEEDBACK. This process is repeated until there is a "lock" condition meaning that the selected signal has been synchronized with the external signal. Once this occurs, the output signal OUTPUT is provided by the phase generator 32 to serve as the clock for a synchronous device, such as an SDRAM. The phase generator 32 is provided to preserve the edge information of the incoming signal. At high frequencies (such as 2.5 GHz-4 GHz) this information is lost because of the dividing process. The phase generator 32 allows for preservation and recreated of the edge information so that the signal may be used for timing purposes and synchronization.

FIG. 3 illustrates the clock divider/generator 26 circuit of FIG. 2 in greater detail. As discussed above, the clock divider/generator 26 divides a clock signal by a predetermined amount, either 3 or 6, and generates three clock signals, each ⅓ or ⅙ the frequency of the original clock signal. These signals do not overlap each other and have unique phase relationship with respect to the external clock. As described further below, the exemplary clock divider/generator 26 is configurable to provide an output signal having a frequency equal to ⅓ the frequency of the input clock signal ("By 3 divider") or ⅙ the frequency of the input clock signal ("By 6 divider") depending on the state of a control signal.

The Clock divider/generator 26 may receive the buffered clock signal CLKIN, a reset signal R and a divide by 6 flag DIV6. The clock signal CLKIN may comprise the clock signal generated by a system clock (XCLK of FIG. 1) or an output generated by another clock divider, as previously described with reference to FIG. 1. The clock signal CLKIN may have a frequency in the range of 2.5 to 4 gigahertz, for example. The reset signal R provides a mechanism to reset the clock divider/generator 26 without having to power down the clock divider/generator 26. In one embodiment, the clock divider/generator 26 may reset if the reset signal R changes from a low voltage level ("low") to a high voltage level ("high").

The illustrated Clock divider/generator 26 also receives the divide by 6 flag DIV6. In one embodiment, the selection signal DIV6 is a digital signal configured to control whether the clock divider/generator 26 divides the clock signal CLKIN by 3 or by 6. In one exemplary embodiment, if the divide by 6 flag is high, the clock divider/generator 26 may be configured to divide by 6. If the divide by 6 flag is low, the clock divider/generator 26 may be configured to divide by 3 rather than 6.

As described above and further described below, the clock divider/generator 26 is configurable to output a clock signal with a frequency equal to ⅓ or ⅙ of the input clock signal CLKIN. While not illustrated in FIG. 3, those skilled in the art will appreciate that in alternate embodiments the clock divider/generator 26 can be configured to divide the clock signal CLKIN by any suitable multiple of three and six (i.e., nine, twelve, eighteen, etc.). Those skilled in the art will further appreciate that the clock divider/generator 26 is illustrated with a single Divide-by-3-or-6 circuit for illustrative purposes only. In alternate embodiments, the clock divider/generator 26 may comprise multiple divide-by-3-or-6 circuits. Moreover, as described herein, the components of the divide-by-3-or-6 circuit may be reorganized or duplicated to create circuits configured to divide the clock signal CLKIN by intervals other than those described.

The clock divider/generator 26 includes a By 2 divider 34 and a By 3 divider 36. In the present exemplary embodiment, the clock divider/generator 26 receives a buffered clock signal CLKIN at the By 2 divider 34. The By 2 divider 34 divides the frequency of the buffered clock signal CLKIN by 2, thereby producing an output signal having a frequency of CLKIN/2. The output of the By 2 divider 34 is transmitted through an inverter 38 and a NAND gate 40. The NAND gate 40 also receives the selection signal DIV6. As described above, the state of the selection signal DIV6 will ultimately determine whether the output signal from the clock divider/generator 26 will have a frequency of ⅓ or ⅙ that of the buffered input signal CLKIN. The buffered input signal CLKIN and the selection signal DIV6 are also delivered to a NAND gate 42. The selection signal DIV6 is delivered to the NAND gate 42 through an inverter 41 to ensure proper signaling. The output of the NAND gate 40 and the output of the NAND gate 42 are transmitted through another NAND gate 43 before being transmitted as the clock signal CIN to the By 3 divider 36. Thus, the clock signal CIN will have the same frequency as the buffered input signal CLKIN or a frequency equal to ½ that of the buffered input signal CLKIN, depending on the state of the selection signal DIV6.

The By 3 divider 36 is configured to divide the frequency of the clock signal CIN by three and to produce three output signals OUT<0:2> each being ⅓ the frequency of the clock signal CIN. The By 3 divider comprises two partial divider circuits 44a and 44b. As illustrated, each of the partial divider circuits 44a and 44b includes a clock input (CLK) and a reset (R) input. The partial divider circuits 44a and 44b are coupled to each other via their respective inputs (D1 and D2) and their respective outputs (CLOCKOUT). In particular, the input D1 on the partial divider circuit 44a may be coupled to the output CLOCKOUT of the partial divider circuit 44b, the output CLOCKOUT of the partial divider circuit 44b, and the input D2 of the partial divider circuit 44b. The input D2 of the partial divider circuit 44a may be coupled to the output CLOCKOUT of the partial divider circuit 44a. Further, the input D1 of the partial divider circuit 44b may be coupled to the output CLKOUT from the partial divider circuit 44a.

The output signal of the first partial divider 44a is also connected to a series of three inverters 46a-c. The output of the third inverter 46c is the clock <0> signal. The output of the second partial divider 44b also is transmitted through a series of three inverters 47a-c. The output of the third inverter 47c is the clock <1> signal. The output signals of both partial dividers 38a and 38b are also transmitted to a NAND gate 48. The output of the NAND gate 48 is received by an inverter 49, and the output of the inverter 49 is the clock <2> signal. All three clock signals are produced by the clock divider/generator 26 as OUT<0:2> as shown in FIG. 3. Those skilled in the art will appreciate that FIG. 3 is simply a single embodiment of the clock divider/generator 26 and is used for illustrative purposes. Various other combinations may be used to achieve a similar result.

If the selection signal DIV6 is set to enable the clock divider/generator 26 as a By 6 divider, each of the three outputted clock signals OUT<0:2> are separated from each other by 2tCK, have a logical high of 2tCK and have a period of 6tCK. There is no overlap of the duty cycles between the three signals, as illustrated with reference to FIG. 4. As a consequence, a selected signal will never be more than 2tCK out of phase with the input signal and thus, advantageously, the length of the delay line 14 of the DLL 10 can be reduced. Thus, the present system significantly increases efficiency.

Figure 4:
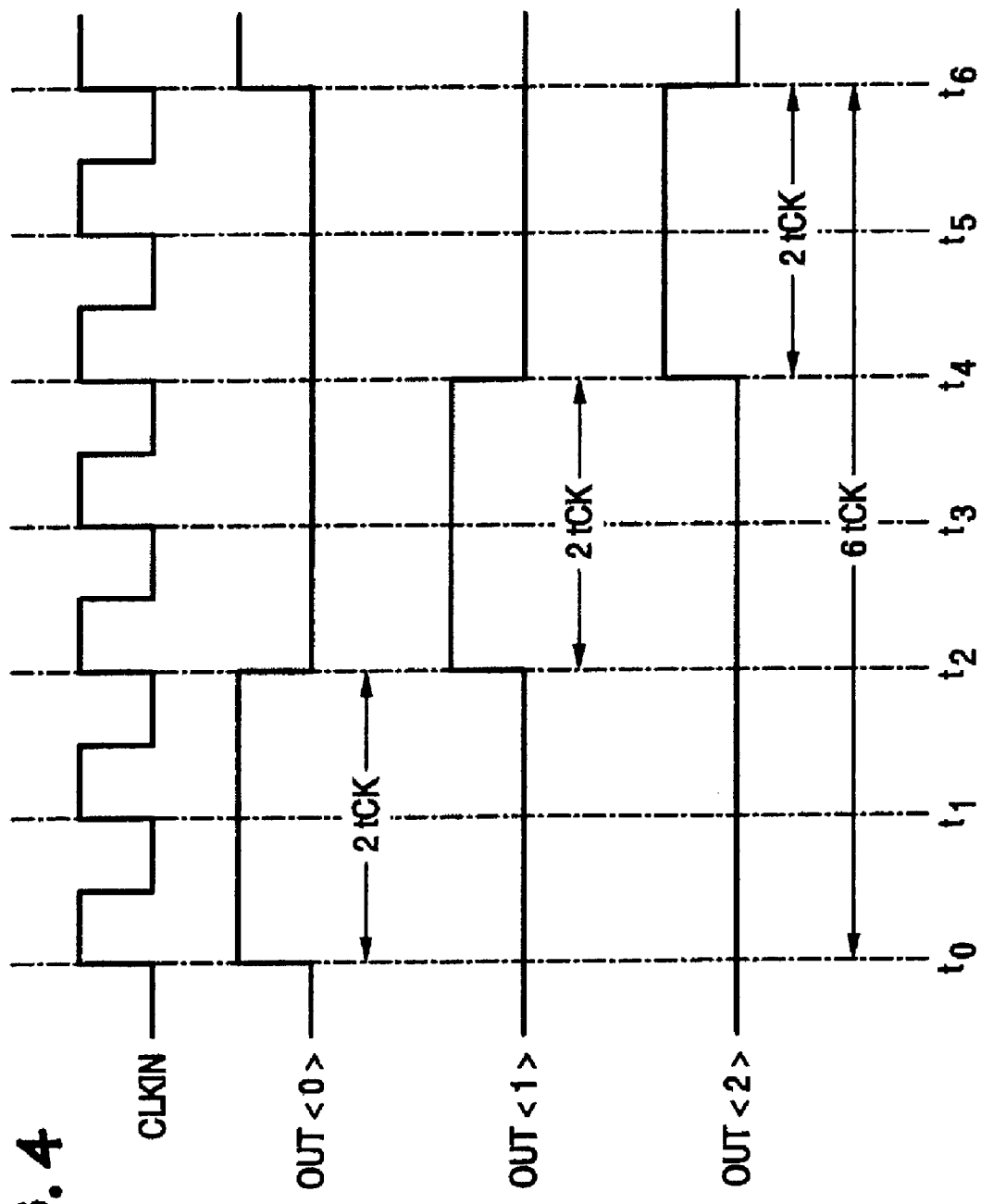
FIG. 4 is a timing diagram indicating timing of signals described and illustrated in FIG. 3, in accordance with embodiments of the present invention.

FIG. 4 is a timing diagram illustrating some of the signals described and referenced with regard to FIG. 3. As illustrated in FIG. 4 and described above, each of the outputted clock signals OUT<0>, OUT<1> and OUT<2> are logically high at different, non-overlapping times. Each outputted clock signal OUT<0:2> is logically high for 2tCK. For instance, the output clock signal OUT<0> switches high at time $t_0$ and switches low at time $t_2$. The output clock signal OUT<1> switches high at time $t_2$ and switches low at time $t_4$. The output clock signal OUT<2> switches high at time $t_4$ and switches low at time $t_6$. As will be appreciated, the output clock signal OUT<0> will switch high again at time $t_6$.

Figure 5:
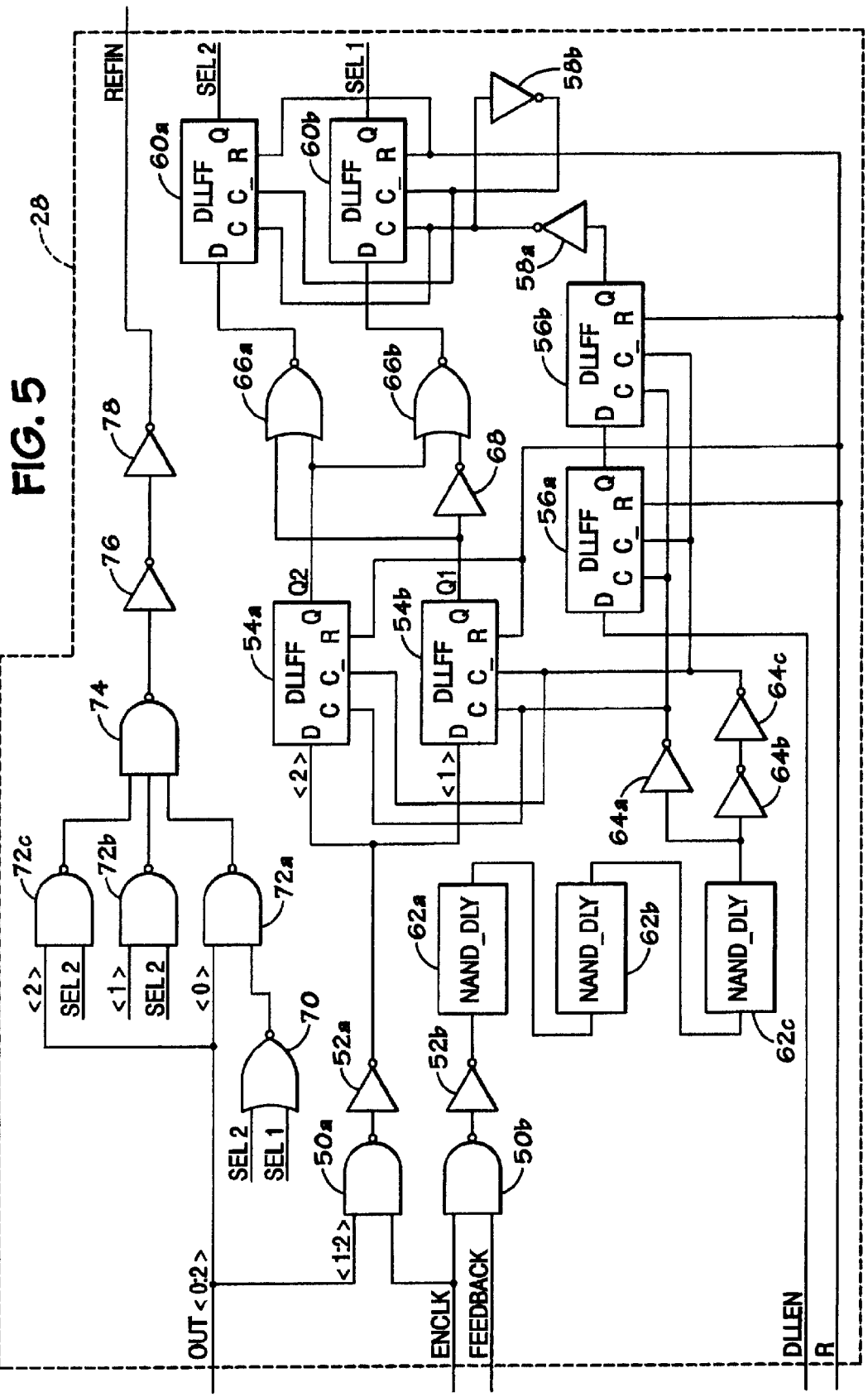
FIG. 5 is a schematic depiction of the clock multiplexing logic of FIG. 2, in accordance with embodiments of the present invention.

FIG. 5 is a partial schematic of the clock mux logic circuit 28 of FIG. 2. The clock mux logic circuit 28 selects one of the three output signals OUT<0:2> generated by the clock divider/generator 26 for synchronization. As illustrated in FIG. 5, the clock mux logic 28 receives the three clock signals OUT<0:2> from the clock divider/generator 26. Clock signals <1> and <2> are transmitted to a first NAND gate 50a and an inverter 52a before they are fed into D flip-flops 54a and 54b. The output of the first D flip-flop 54a is represented as Q2 and the output of the second D flip-flop 54b is represented by Q1. The outputs (Q1 and Q2) of the respective D flop-flops 54a and 54b determine which signal will be selected.

The clock mux logic 28 also receives a clock enable signal EnCLK, a feedback signal FEEDBACK, a delay-lock loop enable signal DLLEN and a reset signal R. The clock enable signal EnCLK is transmitted to the NAND gates 50a-b. The FEEDBACK signal is used for phase comparative purposes and is discussed in further detail below. The DLLEN signal is implemented to enable the DLL 10. The DLLEN signal passes through D flip-flops 56a-b and inverters 58a-b to serve as the clock inputs C and C_on the D flip-flops 60a-b.

The parallel D flip-flops 54a-b are clocked by the FEEDBACK signal. The FEEDBACK signal can be any signal with which clock signal <1> and <2> are to be compared. For the purposes of FIG. 5, the FEEDBACK signal is provided from the feedback model 30 (FIG. 2) and is generated from the original signal OUT<0>. The FEEDBACK signal passes through a NAND gate 50b and an inverter gate 52b before entering several delay elements 62a-c. The delay elements 62a-c are used to build a timing window for phase comparison, as will be appreciated. The FEEDBACK signal is then passed through an inverter 64a before serving as the clock (C) for the D flip-flops 54a-b. The inverse of this signal is transmitted through the inverters 64b-c to the C_input of the D flip-flops 54a-b. The D flip-flops 54a-b are edge triggered and latch their D inputs upon the rising edge of the C input. Therefore, in FIG. 5, when the FEEDBACK signal introduces a rising edge to the D flip flops 54a-b, they lock the signals OUT <1> and <2> in the state they are in at that instant. This effectively serves to compare the respective signals OUT <2> and <1> with the FEEDBACK signal. The latched outputs Q1 and Q2 from the D flip-flops 54a-b ultimately determine what clock signal will be used for synchronization. After the selection of the clock signal, the clock mux logic 28 may be disabled to save power. The clock mux logic 28 may be disabled by using the enable clock signal ENCLK, for instance. That is to say, in accordance with one embodiment, selection of the input signal for synchronization only occurs after reset and will not change during normal operation.

As explained above, the clock signals OUT <1> and <2> are compared with the FEEDBACK signal to determine their relative phase relationships. The outputs from the D flip-flops 54a-b are used to determine what clock signal will be selected. The signal from the output Q2 of the first D flip-flop 54a is transmitted into two parallel NOR gates 66a and 66b. The first NOR gate 66a also receives the signal from the Q1 output of the second D flip-flop 54b. The second NOR gate 66b receives the signal from the output Q2 and an inverted signal (through an inverter 68) from the output Q1. The outputs of the two NOR gates 66a and 66b are then transmitted to the inputs D of the D flip-flops 60a and 60b and are outputted as SEL1 and SEL2 signals respectively. The truth table below shows the possible states of the two signals from the outputs Q1 and Q2 as they enter the NOR gates 66a and 66b and the resulting selected signal.

TABLE 1

| Clock selection | | |
|---|---|---|
| Q2 | Q1 | Clock selected OUT |
| 1 | X | <0> |
| 0 | 1 | <1> |
| 0 | 0 | <2> |

When the DLL reset signal R is initiated, SEL1 and SEL2 are forced low and the OUT<0> is selected. The truth table shows that whenever Q2 is a "1" OUT<0> will be selected; if Q2 is a "0" and Q1 is a "1" OUT<1> will be selected; if both Q2 and Q1 are "0" OUT<2> will be selected. The final selection of the signal is determined using the outputs of the D flip-flops 60a-b which are then fed through a number of logic gates to make the final signal selection, as described below. Essentially, if OUT<1> is selected, the output signal SEL1 from the D flip-flop 60b will be "high" and the output signal SEL2 from the D flip-flop 60a will be "low." Similarly, if OUT<2> is selected, the SEL2 signal will be "high" and the SEL1 signal will be "low." If neither SEL1 nor SEL2 is "high," then the circuit will select the OUT<0>.

The output signals from the D flip flops 60a and 60b are compared through a NOR gate 70. The output of the NOR gate 70 is transmitted to a NAND gate 72a that also receives the OUT<0>. This NAND gate 72a is electrically in parallel with two other NAND gates 72b and 72c. One NAND gate 72b receives the SEL1 signal from the D flip-flop 60b and the OUT<1> signal (from the clock divider/generator 26) and the other NAND gate 72c receives the SEL2 signal from the D flip-flop 60a and the OUT<2> signal (from the clock divider/generator 26). The outputs from each of the three NAND gates 72a-c are transmitted to a three input NAND gate 74 and through two inverters 76 and 78 before leaving the clock mux logic 28 as the REFIN signal (FIG. 2) which may be delivered to the DLL 10. The REFIN signal represents the clock signal selected as described in the above discussion for the purposes of synchronization based upon its phase characteristics relative to the feedback signal. Those skilled in the art will realize that there may be many alternative embodiments of the present invention and that FIGS. 2-5 are simply exemplary embodiments. These alternative embodiments may include the additional gates or modified configurations to effectuate the same or a similar result.

As will be appreciated, the efficiency of the synchronization process may be improved by implementing embodiments of the present invention to select the input signal for use during synchronization. By enabling the selection of the input signal, the delay line 14 may be designed with fewer delay elements 15. Advantageously, by reducing the number of delay elements, the layout area may be reduced. Further, clock loading is reduced, thereby saving power and processing speed. Further power consumption is reduced by using fewer delay elements. Still further, lock time of the circuit is advantageously reduced.

Figure 6:
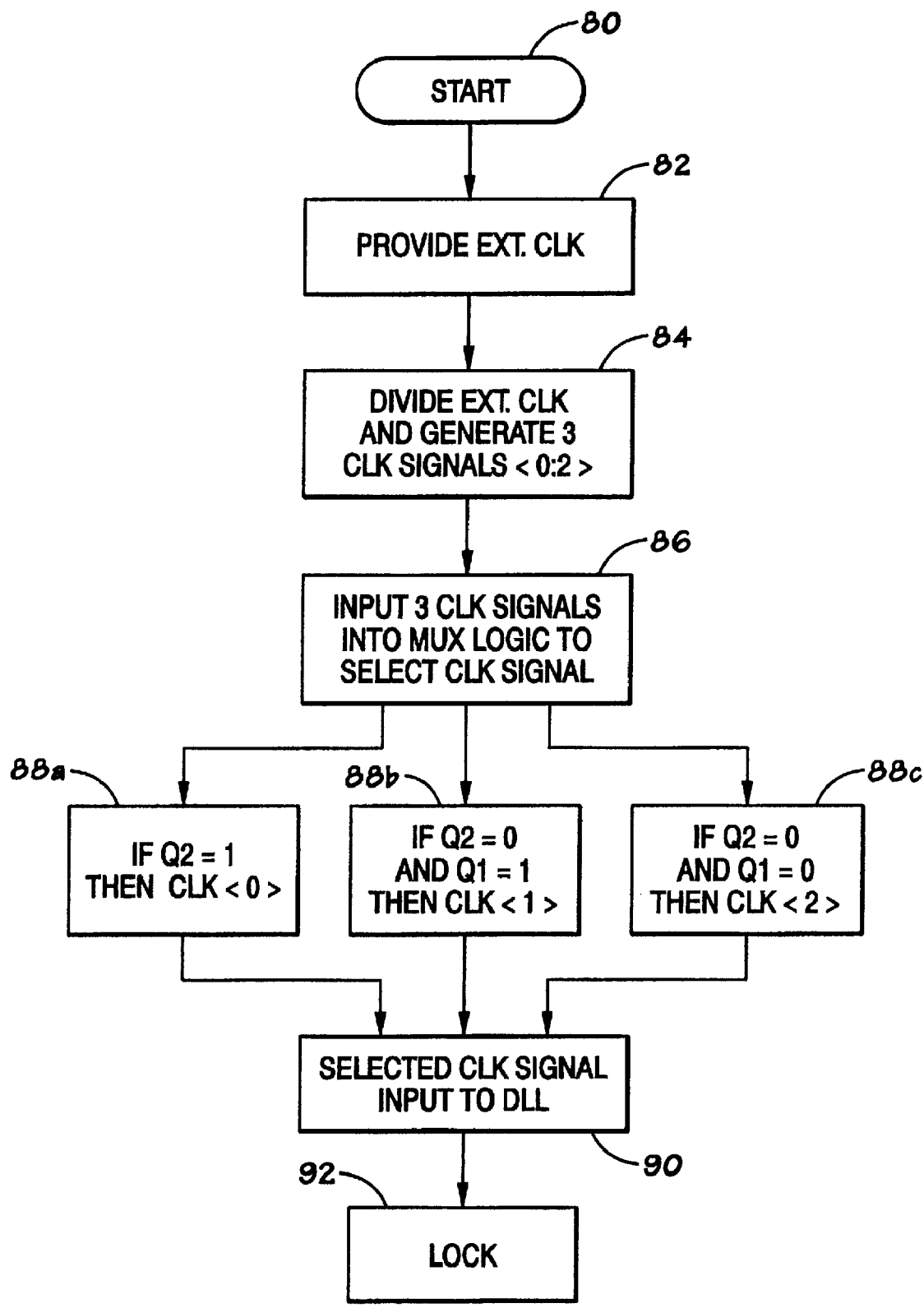
FIG. 6 is a flow chart illustrating the synchronization of a signal in accordance with embodiments of the present invention.

FIG. 6 shows a flow chart of the system and method for generating and selecting clock signals. To start (block 80), an external clock is provided as shown in block 82. The external clock is then divided by either 3 or 6 and three clock signals are generated by the clock divider/generator 26, as indicating in block 84. Next, the three clock signals are delivered to the clock mux logic 28 where one of the three signals will be selected for synchronization purposes, as indicated in block 86. Blocks 88*a-c* illustrate the selection process. Specifically, if Q2 is "1" then clock <0> is chosen (block 88*a*); if Q2 is "0" and Q1 is "1" then clock <1> is chosen (block 88*b*); if Q2 and Q1 are "0" then clock <2> is selected (block 88*c*). Block 90 shows that the selected clock signal is sent to the DLL 10. Once the signal is synchronized with the external clock signal, or locked, as indicated in block 92, the selected clock signal can be used in synchronous systems, such as an SDRAM.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method comprising:
   receiving an input signal;
   dividing the input signal based on a divider value to produce a divided input signal, wherein the divider value is selected based on the state of a control signal;
   generating three clock signals from the divided input signal;
   selecting one of the three clock signals based on a phase relationship of each of the three clock signals to the input signal;
   synchronizing the selected clock signal with the input signal; and
   outputting the synchronized selected clock signal using a phase generator, wherein outputting the synchronized selected clock signal using the phase generator comprises recreating edge information of the input signal.

2. The method of claim 1, wherein the phase relationship for each of the three clock signals is determined by comparing each of the plurality of clock signals with a feedback signal.

3. A method comprising:
   receiving an input signal;
   dividing the input signal based on a divider value to produce a divided input signal, wherein the divider value is selected based on the state of a control signal, wherein the divider value is selected from a first divider value and a second divider value, wherein the first divider value is selected when the control signal is in a first state, wherein the second divider value is selected when the control signal is in a second state, and wherein the first divider value has a value of 3, and wherein the second divider value has a value of 6;
   generating three clock signals from the divided input signal;
   selecting one of the three clock signals based on a phase relationship of each of the three clock signals to the input signal, wherein the three clock signals are each separated by one clock period of the input signal if the first divider value is selected and by two clock periods of the input signal if the second divider value is selected;
   synchronizing the selected clock signal with the input signal; and
   outputting the synchronized selected clock signal using a phase generator.

4. A method comprising:
   receiving an input signal;
   dividing the input signal based on a divider value to produce a divided input signal, wherein the divider value is selected based on the state of a control signal;
   generating three clock signals from the divided input signal;
   selecting one of the three clock signals based on a phase relationship of each of the three clock signals to the input signal wherein the phase relationship of only two of the output signals are compared with the input signal to determine which of the three clock signals should be selected for synchronizing;
   synchronizing the selected clock signal with the input signal; and
   outputting the synchronized selected clock signal using a phase generator.

5. A device comprising:
   a clock divider and generator circuit configured to divide an input signal based on a selection of a divider value from at least two available divider values including a first divider value and a second divider value, and to generate a plurality of clock signals based on the divided input signal, wherein only one of the plurality of clock signals is high at any given time;
   a clock selection circuit configured to receive the plurality of clock signals and to select one of the plurality of clock signals based on a phase relationship with the input signal;
   a delay-lock loop configured to receive the selected clock signal and to place the selected clock signal in phase with the input signal; and
   a feedback model circuit configured to provide a feedback signal to the clock selection circuit.

6. The device of claim 5, wherein the clock divider and generator circuit is configured to receive a control signal, and wherein the selection of either the first divider value or the second divider is based upon the state of the control signal.

7. The device of claim 5, wherein the clock selection circuit is configured to determine the phase relationship for each of the plurality of clock signals by comparing each of the plurality of clock signals with the feedback signal.

8. The device of claim 5, wherein the feedback model circuit exhibits a constant delay time.

9. A device comprising:
   a clock divider and generator circuit configured to divide an input signal based on a selection of a divider value from at least two available divider values including a first divider value and a second divider value, and to generate a plurality of clock signals based on the divided input signal;
   a clock selection circuit configured to receive the plurality of clock signals and to select one of the plurality of clock signals based on a phase relationship with the input signal;
   a delay-lock loop configured to receive the selected clock signal and to place the selected clock signal in phase with the input signal;
   a phase generator configured to generate an output signal that is synchronized with the input signal once a lock condition is detected between the selected clock signal and the input signal, wherein the phase generator is configured to generate the output signal by recreating edge information of the input signal; and
   a feedback model circuit configured to provide a feedback signal to the clock selection circuit.

10. A memory device comprising
a clock divider and generator circuit configured to receive and divide an input signal to generate a first clock signal, a second clock signal, and a third clock signal, wherein only one of the first, second, and third clock signals are high at any time;
a clock selection circuit configured to receive the first, second, and third clock signals, and to select one of the first, second or third clock signals, wherein the clock selection circuit comprises:
 a first flip-flop configured to receive the second clock signal and to provide a first latch signal; and
 a second flip-flop configured to receive the third clock signal and to provide a second latch signal;
 wherein the first, second or third clock signal is selected based on an evaluation of the first and second latch signals;
a synchronization circuit configured to place the selected clock signal in phase with the input signal; and
a feedback model circuit configured to provide a feedback signal to the clock selection logic.

11. The memory device of claim 10, wherein the first and second flip-flops are clocked using the feedback signal.

12. The memory device of claim 10, wherein the selection of the first, second or third clock signal based on the evaluation of the first and second latch signals comprises:
 selecting the first clock signal if the state of the second latch signal is high;
 selecting the second clock signal if the state of the second latch signal is low and the state of the first latch signal is high; and
 selecting the third clock signal if the states of the second latch signal and the first latch signal are low.

13. The memory device of claim 10, wherein the clock selection circuitry comprises a multiplexer circuit.

14. The memory device of claim 10, wherein the clock selection circuitry is configured to be disabled once the selection of the first, second, or third clock signal is made.

15. A method of manufacturing a memory device comprising:
 providing a clock divider and generator circuit configured to receive an input signal and to divide a frequency of the input signal using a divider value to generate three clock signals, wherein the clock divider and generator circuit comprises true single phase logic;
 coupling a clock selection circuit to the output of the clock divider and generator circuit, the clock selection circuit being configured to receive the three clock signals and to select one of the three clock signals based on a phase relationship of each of the three clock signals to the input signal;
 coupling a synchronization circuit to the output of the clock selection circuit, wherein the synchronization circuit is configured to receive the selected clock signal and to place the selected clock signal in phase with the input signal;
 providing a phase generator circuit coupled to the output of the synchronization circuit, wherein the phase generator circuit is configured to generate an output signal that is synchronized with the input signal once a lock condition is detected between the selected clock signal and the input signal; and
 providing a feedback model circuit configured to provide a feedback signal to the clock selection circuit.

16. The method of claim 15, wherein the synchronization circuit comprises a delay lock loop.

17. The method of claim 15, wherein the clock selection logic comprises a multiplexer.

18. A method of manufacturing a memory device comprising:
 providing a clock divider and generator circuit configured to receive an input signal and to divide a frequency of the input signal using a divider value to generate three clock signals, wherein the clock divider and generator circuit comprises true single phase logic, wherein the clock divider and generator circuit is configured to select the divider value from a first divider value or a second divider value based on the state of a control signal, wherein the frequency of the input signal is divided by 3 if the first divider value is selected, wherein the frequency of the input signal is divided by 6 if the second divider value is selected, and wherein the three clock signals are out of phase from each other by one clock period of the input signal if the first divider value is selected and by two clock periods of the input signal if the second divider value is selected;
 coupling a clock selection circuit to the output of the clock divider and generator circuit, the clock selection circuit being configured to receive the three clock signals and to select one of the three clock signals based on a phase relationship of each of the three clock signals to the input signal;
 coupling a synchronization circuit to the output of the clock selection circuit, wherein the synchronization circuit is configured to receive the selected clock signal and to place the selected clock signal in phase with the input signal; and
 providing a feedback model circuit configured to provide a feedback signal to the clock selection circuit.

* * * * *